US006747886B1

United States Patent
Morikawa

(10) Patent No.: US 6,747,886 B1
(45) Date of Patent: Jun. 8, 2004

(54) CONTENT ADDRESSABLE MEMORY WITH SHIFTED ENABLE SIGNAL

(75) Inventor: Koichi Morikawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/401,743

(22) Filed: Mar. 31, 2003

(51) Int. Cl.[7] .............................. G11C 15/00; G11C 7/00
(52) U.S. Cl. .................................. 365/49; 365/189.11
(58) Field of Search .......................... 365/49, 189.07, 365/189.11, 190

(56) References Cited

U.S. PATENT DOCUMENTS 5,285,414 A * 2/1994 Yamauchi et al. ..... 365/189.01

* cited by examiner

Primary Examiner—Thong Q. Le
(74) Attorney, Agent, or Firm—Volentine Francos, PLLC

(57) ABSTRACT

A content addressable memory includes a seek access circuit with four transistors connected in series between a pair of bit lines. The two inner transistors are driven by a data storage circuit; the outer two transistors function as enable transistors. A level shifting circuit receives an enable signal and shifts one or both of the logic levels of the enable signal so as to widen the potential difference between them. The shifted enable signal drives the enable transistors in the seek access circuit. Shifting the high logic level of the enable signal upward speeds up seek access by reducing the on-resistance of the enable transistors. Shifting the low logic level of the enable signal downward reduces subthreshold leakage through the seek access circuit, thereby reducing current consumption, speeding up read and write access, and preventing access errors.

8 Claims, 6 Drawing Sheets

CONTENT ADDRESSABLE MEMORY WITH SHIFTED ENABLE SIGNAL

BACKGROUND OF THE INVENTION

1. Field of the Invention

The present invention relates to a content addressable memory.

2. Description of the Related Art

Content addressable memory (CAM), which provides access to stored data by input of data content instead of input of an address, can dramatically improve the performance of systems that must frequently retrieve or verify data. Some of the classic CAM applications include cache tagging, network switching and routing, data compression, and pattern recognition. Due to the increasing spread of mobile communications and computing, there is now interest in using CAM in a wide range of lightweight, low-power electronic devices, including devices powered by solar batteries.

Various types of CAM cells are known. One type is based on a static random-access memory (SRAM) cell connected between a pair of bit lines. The CAM cell adds a seek access circuit comprising four transistors connected in series between the same pair of bit lines, the two inner transistors being driven by the SRAM cell, the two outer transistors being driven by an enable signal. A match signal is output from a node located between the two inner transistors. The outer transistors speed up access by allowing the bit lines to be driven independently of the match signal line, and by allowing the match signal line to be precharged.

One problem in this type of CAM cell is that the on-resistance of the outer transistors in the seek access circuit slows the output of the match signal.

Another problem is leakage of subthreshold current through the seek access circuit. This problem becomes serious in devices that operate at low power supply voltages, such as the voltage supplied by a solar battery. The necessarily low threshold voltage of the transistors in such devices allows considerable subthreshold current to leak through. (Subthreshold current is current that leaks through a transistor when the gate-source voltage is below the threshold level and the transistor is turned off.) Besides causing needless current consumption, subthreshold leakage delays read and write access to the memory cells and reduces operating margins, raising the possibility of access errors.

SUMMARY OF THE INVENTION

An object of the present invention is to reduce the current consumption of a content addressable memory.

Another object of the invention is to increase the access speed of a content addressable memory.

Yet another object is to prevent access errors.

The invented content addressable memory uses conventional memory cells, each memory cell including a seek access circuit with four transistors connected in series between a pair of bit lines, the two inner transistors in the series being driven by a data storage circuit such as an SRAM cell connected to the bit lines, the outer two transistors functioning as enable transistors. A match signal is obtained from a node disposed between the two inner transistors.

The memory also includes a level shifting circuit that receives an enable signal and shifts at least one of the high and low logic levels of the enable signal, thereby widening the potential difference between the high and low logic levels. The shifted enable signal is used to drive the enable transistors in the seek access circuit in the memory cell.

Shifting the high logic level of the enable signal upward, above the supply voltage level, reduces the on-resistance of the enable transistors, thereby speeding up output of the match signal.

Shifting the low logic level of the enable signal downward, below the ground level, reduces the leakage of subthreshold current through the enable transistors, thereby reducing the current consumption of the memory cell, speeding up read and write access, and preventing access errors.

DETAILED DESCRIPTION OF THE INVENTION

Figure 1:
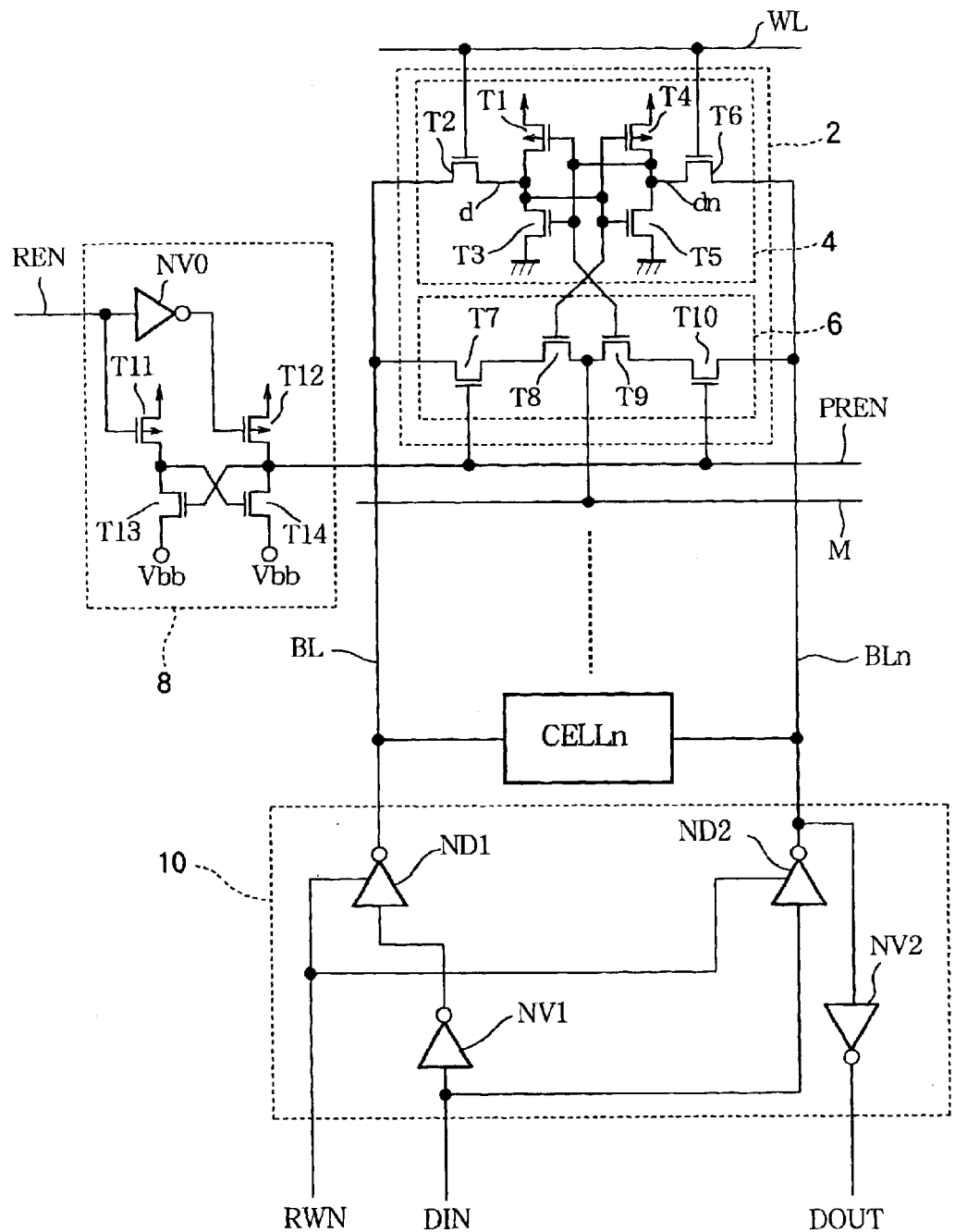
FIG. 1 is a circuit diagram illustrating a first embodiment of the invented content addressable memory.

Embodiments of the invention will now be described with reference to the attached drawings, in which like elements are indicated by like reference characters. Reference characters that denote signal lines will also denote the signals carried on the signal lines.

FIG. 1 shows the internal structure of a memory cell 2 in a first embodiment of the invented content addressable memory. The memory cell 2 comprises a data storage circuit 4 and a seek access circuit 6 connected in parallel between a pair of bit lines BL, BLn. The data storage circuit 4 is also coupled to a word line WL. The seek access circuit 6 is coupled to a shifted enable signal line PREN and a match signal line M.

The data storage circuit 4 has the structure of an SRAM cell, comprising six metal-oxide-semiconductor field-effect transistors T1–T6, of which T1 and T4 are p-channel (PMOS) transistors and T2, T3, T5, and T6 are n-channel (NMOS) transistors. Transistors T1, T3, T4, and T5 form a pair of cross-coupled inverters and thus constitute a bistable latch capable of storing one bit of data. Transistors T2 and T6 couple this bistable latch to the bit lines BL, BLn when the word line WL is driven to the high logic level.

The seek access circuit 6 comprises four n-channel transistors T7, T8, T9, T10 connected in series between the bit lines BL, BLn. The match signal line M is connected to a point between the two inner transistors T8, T9. These two transistors T8, T9 are driven by the data storage circuit 4, the gate of transistor T8 being connected to the drains of transistors T1 and T3 (node d), the gate of transistor T9 being connected to the drains of transistors T4 and T5 (node dn). The two outer transistors T7, T10 have their gates connected to the shifted enable signal line PREN and are driven by the shifted enable signal.

The shifted enable signal line PREN is coupled to a level shifting circuit 8 that receives an enable signal REN. The enable signal REN has a high logic level equal to the power supply potential, denoted by an arrowhead in FIG. 1, and a low logic level equal to the ground potential, denoted by the conventional ground symbol. The level shifting circuit 8 lowers the low logic level of the enable signal REN to generate the shifted enable signal PREN.

The level shifting circuit 8 comprises an inverter NV0, two p-channel transistors T11, T12, and two n-channel transistors T13, T14. The inverter NV0 receives the enable signal REN and generates an inverted enable signal. Transistor T11 has its source coupled to the power supply, and receives the enable signal REN at its gate. Transistor T12 also has its source connected to the power supply, and receives the inverted enable signal at its gate. Transistor T13 has its source connected to a negative bias potential Vbb lower than the ground potential, its gate connected to the drain of transistor T12, and its drain connected to the drain of transistor T11. Transistor T14 has its source connected to the negative bias potential Vbb, its gate connected to the drains of transistors T11 and T13, and its drain connected to the drain of transistor T12. The shifted enable signal PREN is obtained from the interconnected drains of transistors T12 and T14.

In the first embodiment, the power supply voltage or high logic level is half a volt (0.5 V), the ground level or low logic level is zero volts (0 V), and the negative bias potential Vbb is –0.3 V. These voltages are suitable for use in an electronic device powered by solar batteries. Needless to say, however, the invention is not limited to the use of these voltages or to solar-powered devices.

A plurality of memory cells 2 are coupled to the bit lines BL, BLn, forming a column of memory cells; FIG. 1 also indicates the last memory cell (CELLn) in the column. A separate word line, shifted enable signal line, and match signal line are provided for each memory cell in the column. Each shifted enable signal line is driven by a separate level shifting circuit 8. For simplicity, FIG. 1 shows only one word line WL, one shifted enable signal line PREN, one match signal line M, and one level shifting circuit 8.

The bit lines BL, BLn are connected to an input-output circuit 10 comprising, for example, two tri-state buffers ND1, ND2 of the inverting type and two inverters NV1, NV2. In this exemplary input-output circuit 10, bit line BL is connected to the output terminal of tri-state buffer ND1; bit line BLn is connected to the output terminal of tri-state buffer ND2. Both tri-state buffers ND1, ND2 receive a read-write control signal RWN. Tri-state buffer ND2 also receives a data input signal DIN. Tri-state buffer ND1 receives an inverted data input signal generated from DIN by an inverter NV1. Bit line BLn is connected to the input terminal of an inverter NV2 that generates a data output signal DOUT.

The content addressable memory may have a plurality of pairs of bit lines with respective columns of memory cells and input-output circuits. In this case, each shifted enable signal line PREN and match signal line M may be connected to a plurality of memory cells occupying the same positions in different columns.

Next, the operation of the first embodiment will be described. More specifically, the operations of writing, seeking, and reading data in the memory cell 2 in FIG. 1 will be described.

To write a bit of data in the memory cell 2, the bit value is received on the data input signal line DIN, the enable signal REN is driven to the low logic level (0 V), the word line WL is driven to the high logic level, and the read-write control signal RWN is driven to the high logic level, so that the tri-state buffers ND1, ND2 function as inverters. The logic level of the input bit is thus placed on bit line BL, while the inverted logic level of the input bit is placed on bit line BLn. These logic levels are passed through transistors T2 and T6 to the bistable latch.

In the level shifting circuit 8, p-channel transistor T11 is turned on by the low enable signal, while p-channel transistor T12 is turned off. N-channel transistor T14 turns on because its gate receives the power-supply potential through transistor T11. N-channel transistor T13 turns off because its gate receives the negative bias potential Vbb through transistor T14. The shifted enable signal PREN is driven to the negative bias potential Vbb through n-channel transistor T14.

In the seek access circuit 6, the gates of the outer transistors T7, T10 are driven to the negative bias potential Vbb, reducing current flow through these transistors to a negligible level. Substantially all current output by the tri-state buffers ND1, ND2 is therefore used to set the bistable latch in the data storage circuit 4 to the state matching the logic levels on the bit lines BL, BLn. Substantially none of this current is wasted by leakage between the two bit lines. The write operation is thus completed quickly.

While the enable signal REN is low and the outer transistors T7, T10 are turned off, the match signal line M is precharged to the high logic level by a precharging circuit not shown in the drawing.

To seek the data stored in the memory cell 2, a bit of input data is presented on the data input signal line DIN, the enable signal REN is driven to the high logic level (0.5 V), word line WL is driven to the low logic level, and the read-write control signal RWN is driven to the high logic level. The logic level of the input bit is again placed on bit line BL, while the inverted logic level is placed on bit line BLn, but these logic levels do not affect the data storage circuit 4 since transistors T2 and T6 are turned off.

In the level shifting circuit 8, p-channel transistor T11 is turned off by the high enable signal REN, while p-channel transistor T12 is turned on. N-channel transistor T13 turns on because its gate receives the power-supply potential through transistor T12. N-channel transistor T14 turns off because its gate receives the negative bias potential Vbb through transistor T13. The shifted enable signal PREN is driven to the high logic level through p-channel transistor T12, turning on the outer transistors T7, T10 in the seek access circuit 6.

The inner transistors T8, T9 in the seek access circuit 6 are driven according to the data stored in the data storage circuit 4, transistor T8 turning on if node d is high, transistor T9 turning on if node dn is high. If the stored data and the input data DIN match (node d and bit line BL both high or both low, node dn and bit line BLn both low or both high), the match signal M remains at the high level. If the stored data and input data do not match, the match signal line M discharges to the low logic level: through transistors T7 and T8 if node d is high and bit line BL is low, and through transistors T9 and T10 if node dn is high and bit line BLn is low. The match signal M thus remains high to indicate a match between the stored and input data, and goes low to indicate the non-matching state.

To read the data stored in the memory cell 2, the enable signal REN is driven to the low logic level (0 v), supplying the negative bias potential Vbb to the gates of the outer transistors T7, T10 in the seek access circuit 6 as explained in regard to write access, thereby reducing current leakage between the bit lines BL, BLn to a negligible level. Word line WL is driven to the high logic level, turning on transistors T2 and T6 in the data storage circuit 4. The read-write control signal RWN is driven to the low logic level, placing the tri-state buffers ND1, ND2 in the high-impedance state. The bit lines BL, BLn are driven to the logic levels of nodes d and dn, respectively. The stored data value is output through bit line BLn and inverter NV2. The read operation is completed quickly because substantially all of the current supplied by transistor T4 or T5 to bit line BLn is used to drive inverter NV2, none of the supplied current being able leak through transistors T7 and T10 to bit line BL.

Figure 2:
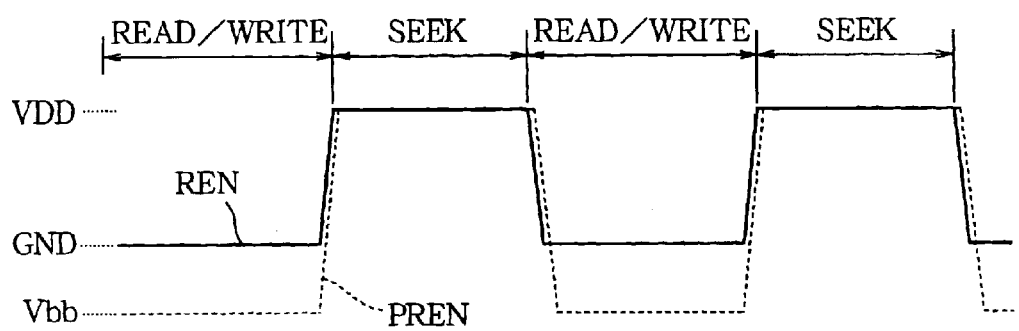
FIG. 2 is a waveform diagram illustrating the enable signal and shifted enable signal in the first embodiment.

In practical applications, seek operations may alternate with read or write operations as shown in FIG. 2, the enable signal REN being driven alternately to the power-supply potential (VDD) and the ground level (GND). The shifted enable signal PREN alternates as shown between the VDD level and the negative bias level Vbb.

As described above, the first embodiment speeds up read and write access by preventing subthreshold current leakage between the bit lines. A further consequence is increased operating margins, providing a safeguard against access errors. By preventing subthreshold current leakage between the bit lines, the first embodiment also reduces current consumption in the idle state, in which the enable signal line REN, word line WL, and read-write control signal line RWN are all low. Yet another effect of the first embodiment is to simplify the design of a content addressable memory by allowing more memory cells to be placed in a single column before subthreshold leakage becomes a problem.

In a conventional content addressable memory lacking the level shifting circuit 8 and supplying the enable signal REN directly to the gates of transistors T7 and T10 in the seek access circuit 6, write access would be delayed because some of the current provided by the tri-state buffers ND1, ND2 would leak as subthreshold current through the seek access circuit 6 instead of being used to set the bistable latch in the data storage circuit 4. Similarly, read access would be delayed because some of the current supplied by transistor T4 or T5 to bit line BLn would leak as subthreshold current to bit line BL instead of being used to drive inverter NV2. Moreover, such subthreshold leakage would occur simultaneously in all the memory cells in the column, not just in the memory cell being accessed. Depending on the number of memory cells per column, the total leakage between the bit lines could become large enough to cause read or write access to fail.

In a conventional content addressable memory lacking the enable signal line REN, the level shifting circuit 8, and the outer transistors T7, T10 in the seek access circuit 6, the subthreshold leakage problem would be aggravated, and read and write access would be further delayed because the match signal line M would have to be driven together with the bit lines BL and BLn, increasing the driven capacitive load.

Figure 3:
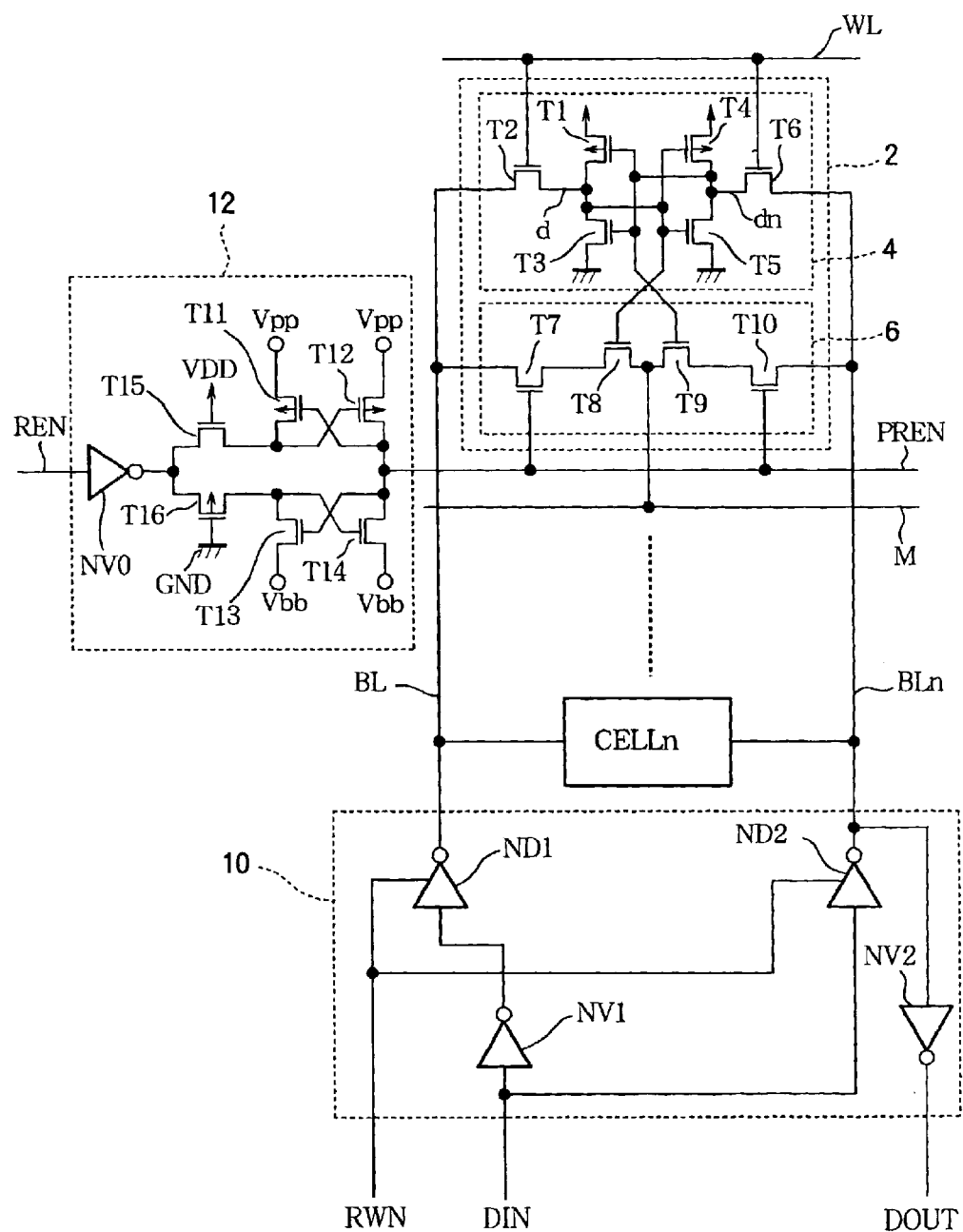
FIG. 3 is a circuit diagram illustrating a second embodiment of the invented content addressable memory.

FIG. 3 illustrates a second embodiment of the invented content addressable memory. The memory cell 2 and input-output circuit 10 have the same structure as in the first embodiment.

The level shifting circuit 12 in the second embodiment comprises an inverter NV0, a pair of p-channel transistors T11, T12, and a pair of n-channel transistors T13, T14 as in the first embodiment, but interconnects these elements differently and adds a third n-channel transistor T15 and a third p-channel transistor T16.

Inverter NV0 receives the enable signal REN and generates an inverted enable signal as in the first embodiment. The high logic level of these signals is again the power-supply level (VDD), the low logic level being the ground level (GND).

A positive bias potential Vpp higher than the power-supply potential VDD is supplied to the sources of p-channel transistors T11 and T12. A negative bias potential Vbb lower than the ground level is supplied to the sources of n-channel transistors T13 and T14. As in the first embodiment, the drains of transistors T12 and T14 are interconnected at a node from which the shifted enable signal PREN is obtained.

The third n-channel transistor T15 receives the inverted enable signal at its source and the power-supply potential VDD at its gate. The drain of this transistor T15 is connected to the drain of transistor T11 and the gate of transistor T12.

The third p-channel transistor T16 receives the inverted enable signal at its source and the ground potential at its gate. The drain of this transistor T16 is connected to the drain of transistor T13 and the gate of transistor T14.

Transistors T15 and T16 are always turned on, but are sized to provided a desired on-resistance. Incidentally, the source and drain designations of each of these transistors T15, T16 are interchangeable.

The positive bias potential Vpp in the second embodiment is 0.8 V. The power supply voltage VDD is 0.5 V, the ground level is 0 V, and the negative bias potential Vbb is −0.3 V, as in the first embodiment.

During read and write access, the second embodiment operates in much the same way as the first embodiment. The enable signal REN is low, so the inverted (high) enable signal turns on transistor T14, pulling the shifted enable signal PREN down to the negative bias level Vbb. This negative level Vbb is fed back to the gates of transistor T11, which turns on, and transistor T13, which turns off. The gate of transistor T12 is pulled up to substantially the Vpp level through transistor T11, which has less on-resistance than transistor T15; transistor T12 is accordingly turned off. The gates of the outer transistors T7, T10 in the seek access circuit 6 are thus held at the negative bias level Vbb, reducing subthreshold leakage current in the seek access circuit 6 to a negligible level.

During seek access, when the enable signal REN is high, the inverted (low) enable signal turns on transistor T12, pulling the shifted enable signal PREN up to the positive bias level Vpp. This positive level Vpp is fed back to the gates of transistor T11, which turns off, and transistor T13, which turns on. The gate of transistor T14 is pulled down to substantially the Vbb level through transistor T13, which has less on-resistance than transistor T16; transistor T14 is accordingly turned off, and the gates of the outer transistors T7, T10 in the seek access circuit 6 are held at the positive bias level Vpp.

During seek access, since the gates of transistors T7 and T10 are biased to a higher level than the power-supply level, these transistors have less on-resistance than in the first embodiment, enabling the match signal line M to discharge more rapidly in the non-matching state. Seek access time is therefore shorter than in the first embodiment. Seek access time is also shorter than in a conventional content addressable memory having transistors T7 and T10 but lacking the level shifting circuit 12.

Figure 4:
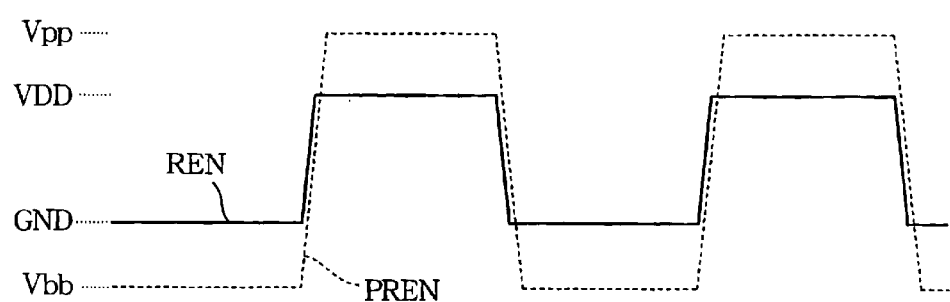
FIG. 4 is a waveform diagram illustrating the enable signal and shifted enable signal in the second embodiment.

FIG. 4 illustrates an operation sequence in which seek access alternates with read or write access in the second embodiment. The shifted enable signal PREN alternates between the Vbb and Vpp levels while the enable signal REN alternates between the ground and VDD levels.

Like the first embodiment, the second embodiment provides the advantages of reduced access times and increased operating margins during read and write operations, and reduced current consumption in the idle state. In addition, the second embodiment provides the advantage of reduced access time and an increased operating margin during seek operations.

Figure 5:
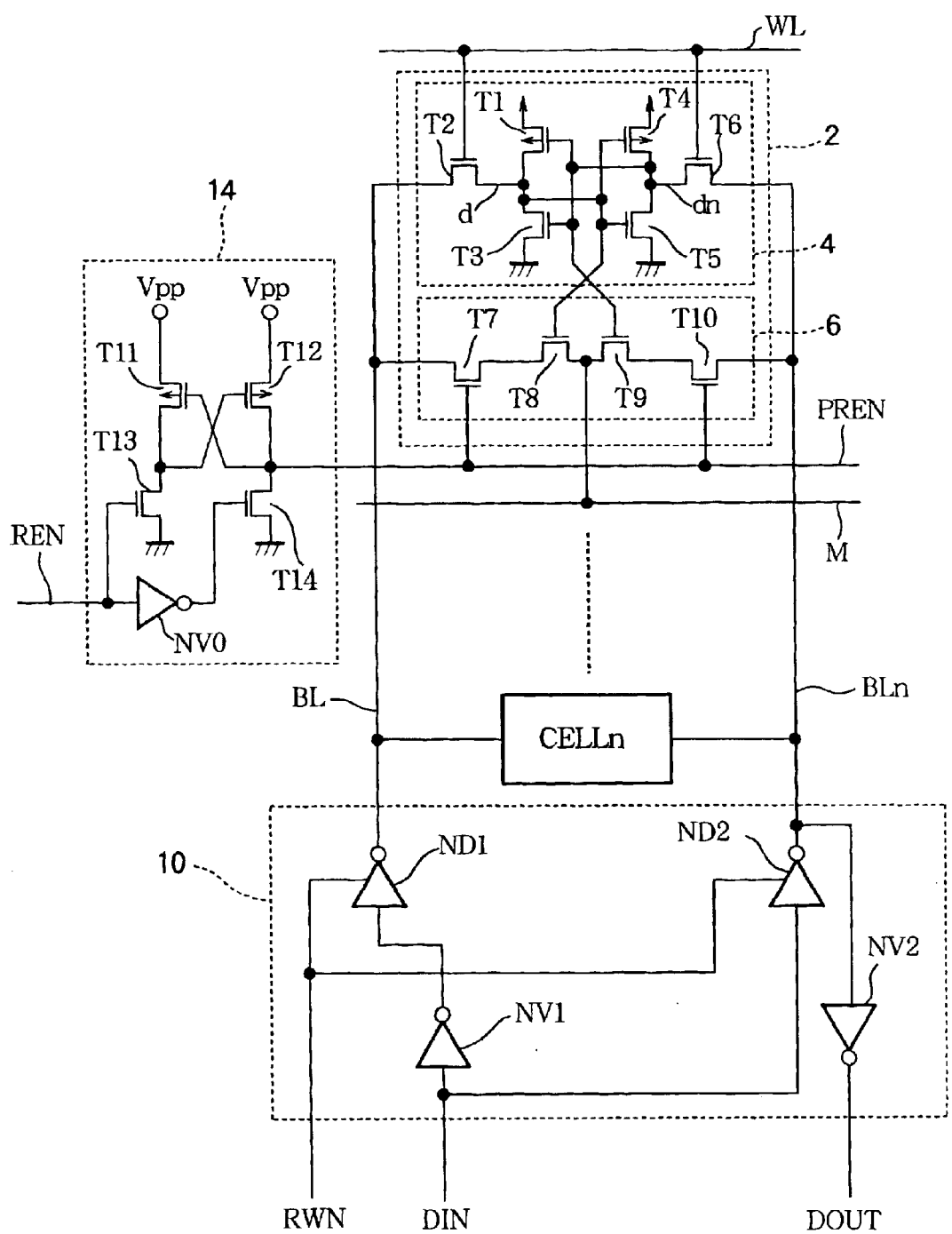
FIG. 5 is a circuit diagram illustrating a third embodiment of the invented content addressable memory.

FIG. 5 illustrates a third embodiment of the invented content addressable memory. The memory cell 2 and input-output circuit 10 have the same structure as in the first embodiment.

The level shifting circuit 14 in the third embodiment comprises an inverter NV0, a pair of p-channel transistors T11, T12, and a pair of n-channel transistors T13, T14 as in the first embodiment, but interconnects these elements differently.

Inverter NV0 receives the enable signal REN and generates an inverted enable signal as in the first embodiment. The high logic level of these signals is again the power-supply level (VDD), the low logic level being the ground level (GND).

A positive bias potential Vpp higher than the power-supply potential VDD is supplied to the sources of p-channel transistors T11 and T12. The ground potential is supplied to the sources of n-channel transistors T13 and T14. The drains of transistors T12 and T14 are interconnected at a node from which the shifted enable signal PREN is obtained, this node also being connected to the gate of transistor T11. The drains of transistors T11 and T13 are interconnected at a node that is also connected to the gate of transistor T12. The enable signal REN is supplied to inverter NV0 and the gate of transistor T13. The inverted enable signal output from inverter NV0 is supplied to the gate of transistor T14.

During read and write access, the enable signal REN is low, so the inverted (high) enable signal turns on transistor T14, pulling the shifted enable signal PREN down to the ground level. The ground level is fed back to the gate of transistor T11, which turns on. Transistor T13 is turned off by the low enable signal REN, so the gate of transistor T12 is pulled up to the Vpp level through transistor T11. Transistor T12 is accordingly turned off. The gates of the outer transistors T7, T10 in the seek access circuit 6 are held at the ground level; both of these transistors are turned off.

During seek access, the enable signal REN goes high, turning on transistor T13, and the inverted enable signal goes low, turning off transistor T14. The gate of transistor T12 is pulled down to the ground level through transistor T13. Transistor T12 accordingly turns on, pulling the shifted enable signal PREN up to the positive bias level Vpp. The positive level Vpp is fed back to the gate of transistor T11, which turns off.

Figure 6:
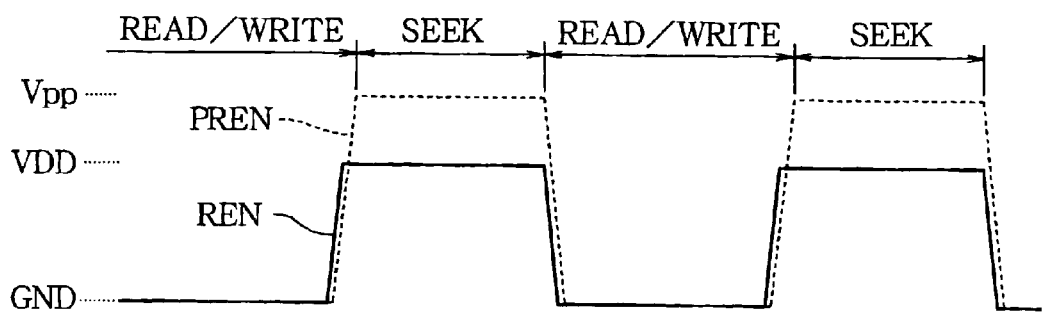
FIG. 6 is a waveform diagram illustrating the enable signal and shifted enable signal in the third embodiment.

FIG. 6 illustrates waveforms of the enable signal REN and shifted enable signal PREN when seek access alternates with read or write access in the third embodiment. During seek access, the gates of the outer transistors T7, T10 in the seek access circuit 6 are held at the positive bias level Vpp, and the on-resistance of these transistor is reduced accordingly. The reduced on-resistance of transistors T7, T10 enables the match signal line M to discharge faster than in the first embodiment or a conventional content addressable memory, shortening the seek access time and increasing the seek operating margin.

Since the third embodiment does not reduce subthreshold current leakage, it is suitable for a content addressable memory with relatively few memory cells per column, or for a content addressable memory operating at a higher power supply voltage than the 0.5 V used in the first and second embodiments.

The invention is not limited to the circuit structures described in the above embodiments and shown in the drawings. Those skilled in the art will recognize that many variations are possible. For example, the logic levels on the word lines may also be shifted. The scope of the invention should accordingly be determined from the appended claims.

What is claimed is:

1. A content addressable memory comprising:
   at least one memory cell including a data storage circuit and a seek access circuit connected in parallel between a pair of bit lines, the seek access circuit including four transistors connected in series between the bit lines, the inner two of the four transistors being driven by the data storage circuit to generate a match signal indicating a match between data presented on the bit lines and data stored in the data storage circuit; and
   a level shifting circuit receiving an enable signal having high and low logic levels, shifting at least one of the high and low logic levels to widen a potential difference between the high and low logic levels, and using the shifted enable signal to drive the outer two of the four transistors in the seek access circuit of the memory cell.

2. The content addressable memory of claim 1, wherein the level shifting circuit lowers the low logic level of the enable signal.

3. The content addressable memory of claim 2, wherein the level shifting circuit comprises:
   an inverter receiving the enable signal and generating an inverted enable signal;
   a first p-channel transistor having a source receiving a first potential equal to the high logic level of the enable signal, a gate receiving the enable signal, and a drain;
   a second p-channel transistor having a source receiving the first potential, a gate receiving the inverted enable signal, and a drain;
   a first n-channel transistor having a source receiving a second potential lower than the low logic level of the enable signal, a gate connected to the drain of the second p-channel transistor, and a drain connected to the drain of the first p-channel transistor; and
   a second n-channel transistor having a source receiving the second potential, a gate connected to the drain of the first p-channel transistor, and a drain connected to the drain of the second p-channel transistor, the shifted enable signal being obtained from the drains of the second p-channel transistor and the second n-channel transistor.

4. The content addressable memory of claim 2, wherein the level shifting circuit also raises the high logic level of the enable signal.

5. The content addressable memory of claim 4, wherein the level shifting circuit comprises:
   an inverter receiving the enable signal and generating an inverted enable signal;
   a first p-channel transistor having a source receiving a first potential higher than the high logic level of the enable signal, a gate, and a drain;
   a second p-channel transistor having a source receiving the first potential, a gate, and a drain;
   a first n-channel transistor having a source receiving a second potential lower than the low logic level of the enable signal, a gate, and a drain;

a second n-channel transistor having a source receiving the second potential, a gate, and a drain connected to the drain of the second p-channel transistor, the shifted enable signal being obtained from the drains of the second p-channel transistor and the second n-channel transistor;

a third n-channel transistor having a source receiving the inverted enable signal, a gate receiving a potential equal to the high logic level of the enable signal, and a drain connected to the drain of the first p-channel transistor and the gate of the second p-channel transistor; and a third p-channel transistor having a source receiving the inverted enable signal, a gate receiving a potential equal to the low logic level of the enable signal, and a drain connected to the drain of the first n-channel transistor and the gate of the second n-channel transistor.

6. The content addressable memory of claim 1, wherein the level shifting circuit raises the high logic level of the enable signal.

7. The content addressable memory of claim 6, wherein the level shifting circuit comprises:

an inverter receiving the enable signal and generating an inverted enable signal;

a first p-channel transistor having a source receiving a first potential higher than the high logic level of the enable signal, a gate, and a drain;

a second p-channel transistor having a source receiving the first potential, a gate, and a drain;

a first n-channel transistor having a source receiving a second potential equal to the low logic level of the enable signal, a gate receiving the enable signal, and a drain connected to the drain of the first p-channel transistor and the gate of the second p-channel transistor; and a second n-channel transistor having a source receiving the second potential, a gate receiving the inverted enable signal from the inverter, and a drain connected to the drain of the second p-channel transistor and the gate of the first p-channel transistor, the shifted enable signal being obtained from drains of the second p-channel transistor and the second n-channel transistor.

8. The content addressable memory of claim 1, wherein the data storage circuit is a static random-access memory cell.

* * * * *